(12) United States Patent
Wu (10) Patent No.: US 12,315,591 B2
(45) Date of Patent: May 27, 2025

(54) OUTPUT CONTROL INTERFACE CIRCUIT FOR STATIC RANDOM ACCESS MEMORY AND OUTPUT CONTROL METHOD FOR THE SAME

(71) Applicant: REALTEK SEMICONDUCTOR CORP., Hsinchu (TW)

(72) Inventor: Kuo-Chi Wu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 178 days.

(21) Appl. No.: 18/221,642

(22) Filed: Jul. 13, 2023

(65) Prior Publication Data
US 2024/0021227 A1    Jan. 18, 2024

(30) Foreign Application Priority Data
Jul. 14, 2022   (TW) .................................. 111126398

(51) Int. Cl.
*G11C 11/419*     (2006.01)
*G11C 7/10*       (2006.01)
*G11C 7/20*       (2006.01)
*G11C 7/22*       (2006.01)

(52) U.S. Cl.
CPC .............. *G11C 7/20* (2013.01); *G11C 7/1063* (2013.01); *G11C 7/222* (2013.01)

(58) Field of Classification Search
CPC ............ G11C 7/20; G11C 7/1063; G11C 7/22
See application file for complete search history.

(56) References Cited

U.S. PATENT DOCUMENTS

| | | | |
|---|---|---|---|
| 12,189,968 B1 * | 1/2025 | Kowles | G06F 1/30 |
| 2010/0080046 A1 * | 4/2010 | Yamaoka | G11C 5/147 365/156 |
| 2012/0218812 A1 * | 8/2012 | Takagi | G11C 11/417 365/154 |
| 2018/0024758 A1 * | 1/2018 | Wang | G11C 7/227 711/103 |
| 2024/0079037 A1 * | 3/2024 | Lee | G11C 29/022 |

\* cited by examiner

*Primary Examiner* — Min Huang
(74) *Attorney, Agent, or Firm* — Li & Cai Intellectual Property (USA) Office (57) ABSTRACT

An output control interface circuit for a static random access memory (SRAM) and an output control method for the same are provided. The output control interface circuit includes an SRAM control detector circuit and an SRAM data controller circuit. The SRAM control detector circuit receives a control signal, determines whether the control signal is stable, and outputs an indication signal correspondingly. The SRAM data controller circuit receives the indication signal and the SRAM output data signal output by the SRAM control detector circuit, and outputs an output data signal according to the indication signal. In response to determining that the control signal is not stable, the SRAM data controller circuit correspondingly outputs the output data signal with a preset value. In response to determining that the control signal is stable, the SRAM data controller circuit outputs the SRAM output data signal as the output data signal correspondingly.

20 Claims, 5 Drawing Sheets

OUTPUT CONTROL INTERFACE CIRCUIT FOR STATIC RANDOM ACCESS MEMORY AND OUTPUT CONTROL METHOD FOR THE SAME

CROSS-REFERENCE TO RELATED PATENT APPLICATION

This application claims the benefit of priority to Taiwan Patent Application No. 111126398, filed on Jul. 14, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an output control interface circuit and an output control method, and more particularly to an output control interface circuit and an output control method for a static random access memory.

BACKGROUND OF THE DISCLOSURE

Static random access memory (SRAM) is widely used in application specific integrated circuit (ASIC) design. In general, an external circuit controls the SRAM to perform a read operation or a write operation through a control signal. Since the SRAM is a volatile memory, when power is no longer supplied thereto, data stored in the SRAM is quickly lost. Therefore, the data inside the SRAM is generally unpredictable when a system is powered on. In addition, before a clock signal and the control signal can stabilize during a power-on process, an output of the SRAM may become unstable, thereby affecting an operation of related circuits.

In a post-layout simulation stage of integrated circuit design, any unexpected outputs resulting under above-mentioned circumstances are regarded as unknown and are passed to next stages of the simulation as such, causing failure in simulation results. Debugging at this stage usually consumes lots of time to track netlists, and even after the errors are corrected, another lengthy period of time is required to re-execute gate-level simulation, thus resulting in unnecessary time being spent on debugging.

SUMMARY OF THE DISCLOSURE

In response to the above-referenced technical inadequacies, the present disclosure provides an output control interface circuit and an output control method for a static random access memory.

In one aspect, the present disclosure provides an output control interface circuit for a static random access memory (SRAM), the output control interface circuit includes an SRAM control detector circuit and an SRAM data controller circuit. The SRAM control detector circuit receives a control signal input to the SRAM, and is configured to determine whether or not the control signal is stable, and output an indication signal correspondingly. The SRAM data controller circuit is configured to receive the indication signal and an SRAM output data signal output by the SRAM, and output an output data signal according to the instruction signal. In response to determining that the control signal is not stable, the SRAM control detector circuit outputs the indication signal to indicate that the control signal is not stable, and the SRAM data controller circuit correspondingly outputs the output data signal with a preset value. In response to determining that the control signal is stable, the SRAM control detector circuit outputs the indication signal to indicate that the control signal is stable, and the SRAM data controller circuit correspondingly outputs the SRAM output data signal as the output data signal.

In another aspect, the present disclosure provides an output control method for a static random access memory (SRAM), and the output control method includes: configuring a SRAM data controller circuit to receive an indication signal and an SRAM output data signal output by the SRAM; configuring an SRAM control detector circuit to receive a control signal input to the SRAM, and determine whether or not the control signal is stable; in response to determining that the control signal is not stable, configuring the SRAM control detector circuit to output the indication signal to indicate that the control signal is not stable, and configuring the SRAM data controller circuit to correspondingly output the output data signal having a preset value according to the indication signal; and in response to determining that the control signal is stable, configuring the SRAM control detector circuit to output the indication signal to indicate that the control signal is stable, and configuring the SRAM data controller circuit to correspondingly output the SRAM output data signal as the output data according to the indication signal.

Therefore, in the output control interface circuit and the output control method for the SRAM provided by the present disclosure, any influence caused by unstable outputs from the SRAM before it is operatively used by the system can be eliminated through an improved control method, such as to reduce resource consumption such as those relating to unnecessary debugging time in the post-layout simulation stage.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
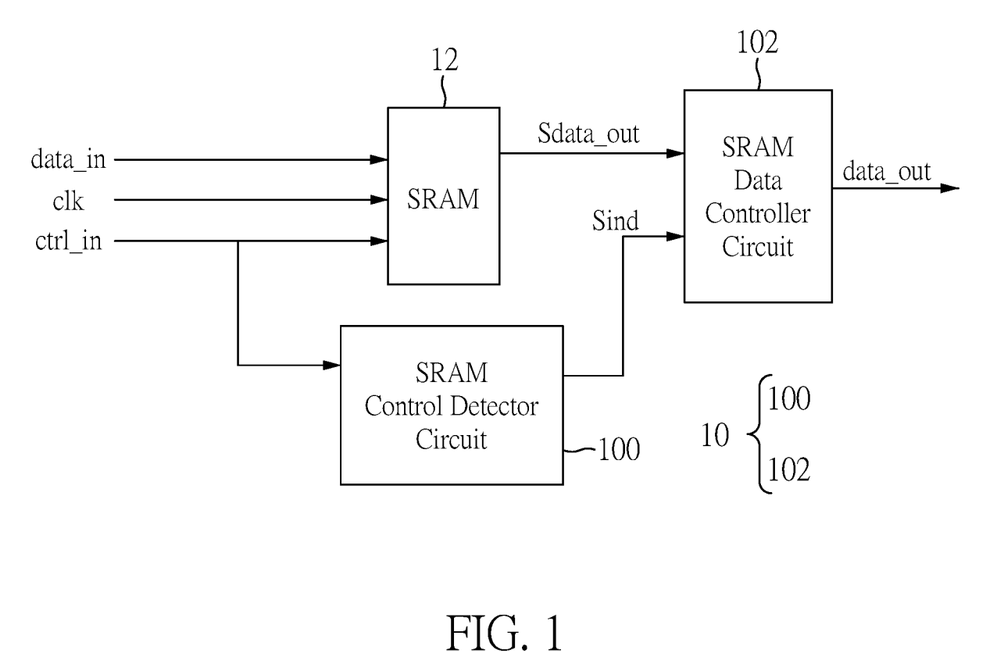
FIG. 1 is a circuit layout of an output control interface circuit according to one embodiment of the present disclosure.

FIG. 1 is a circuit layout of an output control interface circuit according to one embodiment of the present disclosure. Referring to FIG. 1, one embodiment of the present disclosure provides an output control interface circuit 10 for a static random access memory (SRAM) 12, the output control interface circuit 10 includes an SRAM control detector circuit 100 and an SRAM data controller circuit 102. In the embodiment of the present disclosure, the SRAM 12 can include a storage matrix, an address decoder, and a read/write control circuit. In FIG. 1, the SRAM 12 is exemplified by a single-port SRAM, but the present disclosure does not limit a type of SRAM, nor a number of times that the SRAM can be read and written in a single clock cycle. In other words, a two-port or dual-port SRAM can also be used in the embodiments of the present disclosure.

In a stable state of the system, the SRAM 12 can receive a first clock signal clk, a control signal ctrl_in and an input data signal data in from an external circuit, and the control signal ctrl_in can control the SRAM 12 (e.g., through the read/write control circuit) to perform a read operation or a write operation according to the first clock signal clk.

The SRAM control detector circuit 100 can include, for example, a finite-state machine (FSM) circuit that receives the control signal ctrl_in input to the SRAM 12, and the SRAM control detector circuit is configured to determine whether or not the control signal ctrl_in is stable, and to output an indication signal Sind correspondingly.

The SRAM data controller circuit can, for example, include a combinational logic circuit, which can, for example, form a multiplexer configured to receive the indication signal Sind and an SRAM output data signal Sdata_out output by the SRAM 12, and to further output an output data signal data_out according to the indication signal Sind.

Figure 2:
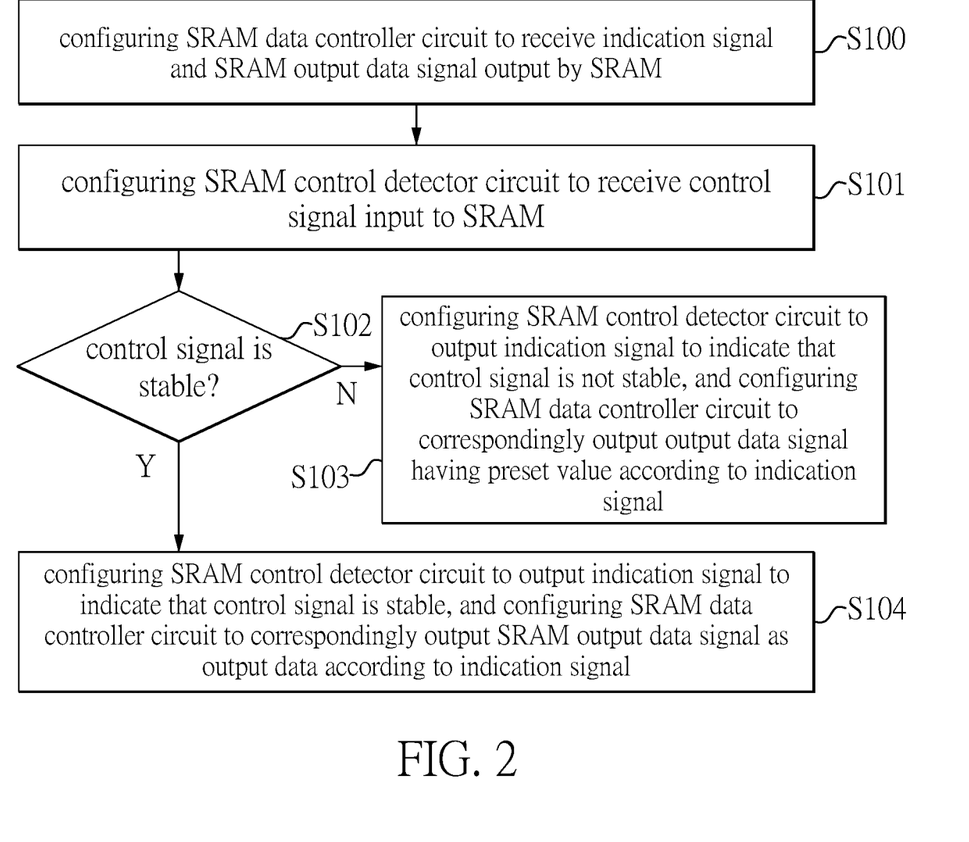
FIG. 2 is a flowchart of an output control method according to one embodiment of the present disclosure.

FIG. 2 is a flowchart of an output control method according to one embodiment of the present disclosure. Referring to FIG. 2, one embodiment of the present disclosure provides an output control method, which is applicable to the output interface 10 and the SRAM 12 shown in FIG. 1. The output control method can include the following steps:

Step S100: configuring the SRAM data controller circuit to receive the indication signal and the SRAM output data signal output by the SRAM.

Step S101: configuring the SRAM control detector circuit to receive the control signal input to the SRAM.

Step S102: configuring the SRAM control detector circuit to determine whether or not the control signal is stable.

In step S102, in response to determining that the control signal is not stable, the output control method proceeds to step S103: configuring the SRAM control detector circuit to output the indication signal to indicate that the control signal is not stable, and configuring the SRAM data controller circuit to correspondingly output the output data signal having a preset value according to the indication signal.

In step S102, in response to determining that the control signal is stable, the output control method proceeds to step S104: configuring the SRAM control detector circuit to output the indication signal to indicate that the control signal is stable, and configuring the SRAM data controller circuit to correspondingly output the SRAM output data signal as the output data according to the indication signal.

In some embodiments of the present disclosure, the SRAM control detector circuit 100 in step S102 can determine whether or not an order of the control signal is stable by detecting whether or not a first read operation comes after a write operation in the control signal ctrl_in. Specifically, if the system is powered on but the SRAM 12 has not been used, internal data of the SRAM 12 is regarded as an unexpected unknown value. Therefore, the SRAM data controller circuit 102 can output the output data signal data_out with the preset value to replace the unknown value. In addition, an occurrence of the write operation in the control signal ctrl_in can be further regarded as a sign that the SRAM 12 is being used, and it can be detected that the first read operation comes after the write operation. Since the SRAM 12 should output the data written in the aforementioned write operation during the first read operation, when the SRAM control detector circuit 100 detects the first read operation, it is regarded that the control signal ctrl_in is determined to be stable, and the output control method proceeds back to step S104, so as to control the SRAM data controller circuit 102 to correspondingly output the SRAM output data signal Sdata_out as the output data signal data_out according to the indication signal Sind.

Figure 3:
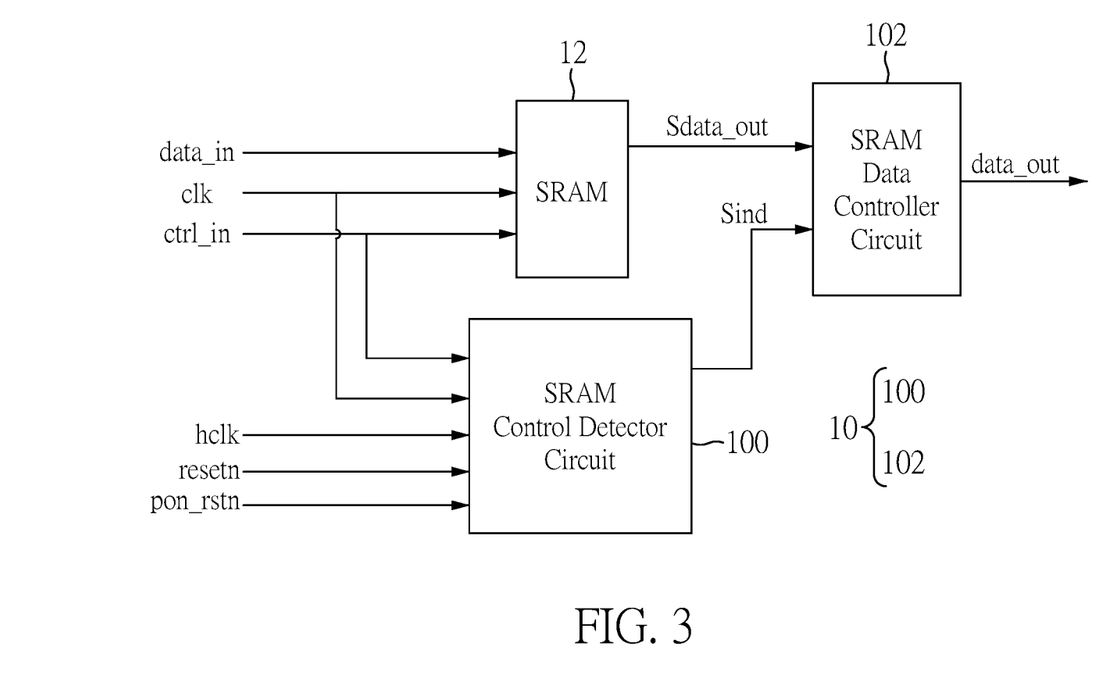
FIG. 3 is a circuit layout of an output interface according to another embodiment of the present disclosure.

Therefore, through the above mechanism, unexpected unknown values output by the SRAM after the system is powered on but before the SRAM 12 has been used can be avoided, so as to avoid the failure of the simulation result in the post-layout simulation stage Reference is made to FIG. 3, which is a circuit layout of an output interface according to another embodiment of the present disclosure. In another embodiment of the present disclosure, other unstable factors before the SRAM is used are further considered, for example, when the system is powered on but not stable, one or more of the first clock signal clk, the system reset signal resetn and the control signal ctrl_in that are input to the SRAM may be unstable. Or, after the system is stable but the SRAM has not been used, not only the internal data are regarded as unexpected, one or more of the first clock signal clk and the control signal ctrl_in that are input to the SRAM may be unstable. Therefore, as shown in FIG. 3, the difference from FIG. 1 is that the SRAM control detector circuit 100 of FIG. 3 receives the system reset signal resetn, the power reset signal pon_rstn, the second clock signal hclk, and the first clock signal clk and the control signal ctrl_in that are input to the SRAM 12.

Figure 4:
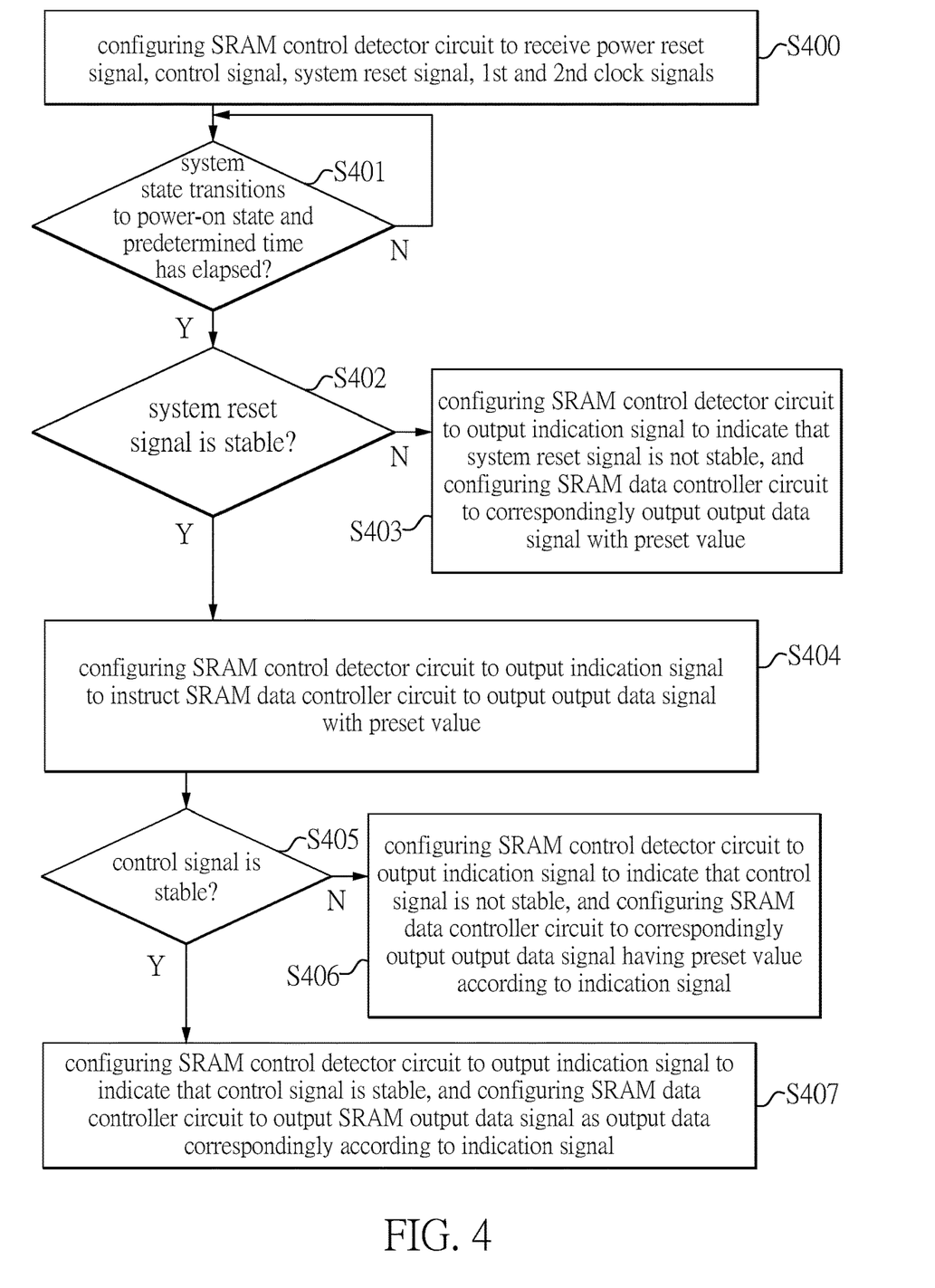
FIG. 4 is a flowchart of an output control method according to another embodiment of the present disclosure.
Figure 5:
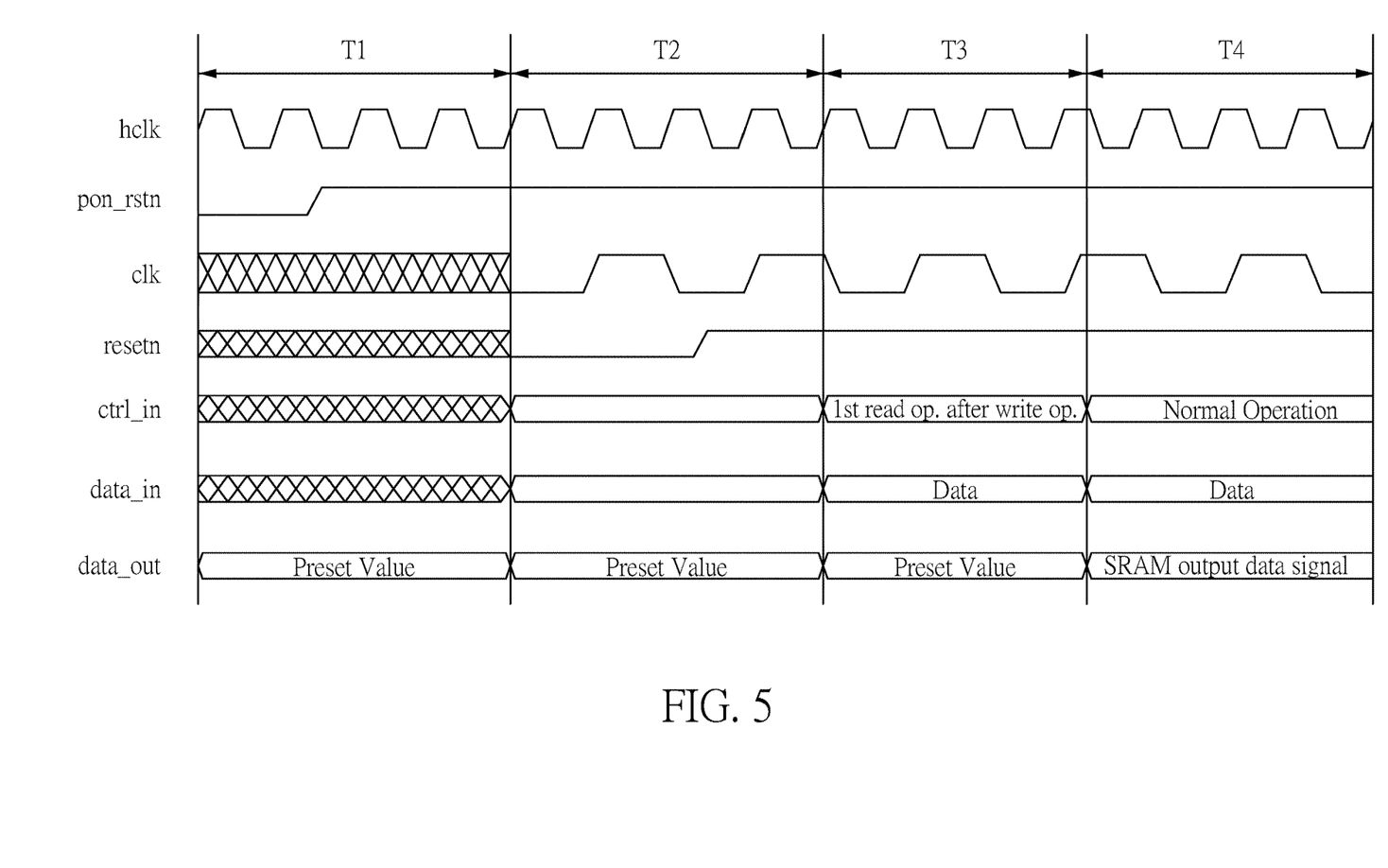
FIG. 5 is a signal timing diagram of an output control interface circuit according to another embodiment of the present disclosure.

Reference can be made to FIGS. 4 and 5 together. FIG. 4 is a flowchart of an output control method according to another embodiment of the present disclosure, and FIG. 5 is a signal timing diagram of an output control interface circuit according to another embodiment of the present disclosure. As shown in FIG. 4, under an architecture of FIG. 3, another embodiment of the present disclosure also provides an output control method, including the following steps:

Step S400: configuring the SRAM control detector circuit to receive the power reset signal, the control signal, the system reset signal, the first clock signal and the second clock signal.

Step S401: configuring the SRAM control detector circuit to determine whether or not a system state transitions to a power-on state according to the power reset signal, and to determine whether or not a predetermined time has elapsed according to the second clock signal. For example, as shown in FIG. 5, in a time period T1, the power reset signal pon_rstn can be used to determine that the system state transitions to the power-on state. Therefore, it is necessary to wait for a predetermined period of time and wait for the system to be stabilized before starting to detect the system reset signals resetn, the first clock signal clk and the control signal ctrl_in.

In step S401, in response to determining that the system state transitions to the power-on state and the predetermined time has elapsed, the output control method proceeds to step S402: determining whether or not the system reset signal is stable.

For example, as shown in FIG. 5, in a time period T2, the second clock signal hclk can be used to determine that the predetermined time is elapsed after the system state transitions to the power-on state, since the system reset signal resetn and the first clock signal clk represent a prerequisite for determining whether the SRAM 12 is normally operated, it is necessary to firstly determine whether or not the system reset signal resetn is stable, and if the determination is negative, then the control signal ctrl_in should not be further considered. At this time, the content of the SRAM 12 (i.e., the SRAM output data signal Sdata_out outputted by the SRAM 12) is regarded as unpredictable unknown values, so that the final output data signal data_out is replaced with the preset value. It should be noted that, in step S402, the second clock signal hclk can be used to detect whether or not the system reset signal resetn is stable by determining whether or not the system reset signal resetn changes from an active state to an inactive state and remains at the inactive state for a predetermined period of time. Furthermore, in order to enable the SRAM control detector circuit 100 to have sufficient analytical capability to determine whether or not the system reset signal resetn is stable, a frequency of the second clock signal hclk utilized needs to be higher than that of the first clock signal clk, such that a result generated by sampling the system reset signal resetn through the second clock signal hclk is meaningful. It should be noted that since the first clock signal clk is provided by the system, the system operates the system reset signal resetn after the first clock signal clk is stable. Therefore, if the system reset signal resetn is determined to be stable in step S402, representing that the first clock signal clk is also stable.

In step S401, in response to determining that the system state does not transition to the power-on state, or the system state transitions to the power-on state but the predetermined period of time is not elapsed, the output control method repeatedly executes step S401.

In step S402, in response to determining that the system reset signal is not stable, the output control method proceeds to step S403: configuring the SRAM control detector circuit to output the indication signal to indicate that the system reset signal is not stable, and configuring the SRAM data controller circuit to correspondingly output the output data signal with the preset value.

In step S402, in response to determining that the system reset signal resetn is stable, the output control method can proceed to step S405: configuring the SRAM control detector circuit to determine whether or not the control signal is stable.

However, preferably, after the system reset signal resetn is determined to be stable, but before determining whether or not the control signal ctrl_in is stable, there will be a window period. At this time, the output control method can firstly proceed to step S404: configuring the SRAM control detector circuit to output the indication signal to instruct the SRAM data controller circuit to output the output data signal with the preset value, so as to avoid outputting an unpredictable unknown value during the window period. At this time, the SRAM control detector circuit 100 simultaneously detects whether or not the appearance of the first read operation comes after the write operation in the control signal ctrl_in, so as to determine whether or not the control signal ctrl_in is stable, as shown in a time period T3 in FIG. 5.

Similar to the process shown in FIG. 2, in step 405, in response to determining that the control signal is not stable, the output control method proceeds to step S406: configuring the SRAM control detector circuit to output the indication signal to indicate that the control signal is not stable, and configuring the SRAM data controller circuit to correspondingly output the output data signal having a preset value according to the indication signal.

On the other hand, in step S405, in response to determining that the control signal is stable, the output control method proceeds to step S407: configuring the SRAM control detector circuit to output the indication signal to indicate that the control signal is stable, and configuring the SRAM data controller circuit to output the SRAM output data signal as the output data correspondingly according to the indication signal. For example, as shown in FIG. 5, since the SRAM control detector circuit 100 detects that the first read operation comes after the write operation in the control signal ctrl_in within the time period T3, it means that both the control signal ctrl_in and the input data signal data in are stable and allow the SRAM 12 to operate normally. Therefore, the indication signal Sind can instruct the SRAM data controller circuit to output the SRAM output data signal Sdata in as the output data signal correspondingly.

[Beneficial Effects of the Embodiments]

In conclusion, in the output control interface circuit and the output control method for the SRAM provided by the present disclosure, any influence caused by unstable outputs from the SRAM before it is operatively used by the system can be eliminated through an improved control method, such as to reduce consumption such as those relating to unnecessary debugging time in the post-layout simulation stage can particularly be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An output control interface circuit for a static random access memory (SRAM), the output control interface circuit comprising:
    an SRAM control detector circuit receiving a control signal input to the SRAM, and configured to determine whether or not the control signal is stable, and output an indication signal correspondingly; and
    an SRAM data controller circuit configured to receive the indication signal and an SRAM output data signal output by the SRAM, and output an output data signal according to the instruction signal,
    wherein, in response to determining that the control signal is not stable, the SRAM control detector circuit outputs the indication signal to indicate that the control signal is not stable, and the SRAM data controller circuit correspondingly outputs the output data signal with a preset value,
    wherein, in response to determining that the control signal is stable, the SRAM control detector circuit outputs the indication signal to indicate that the control signal is stable, and the SRAM data controller circuit correspondingly outputs the SRAM output data signal as the output data signal.

2. The output control interface circuit according to claim 1, wherein the SRAM control detector circuit includes a finite-state machine (FSM) circuit.

3. The output control interface circuit according to claim 1, wherein the SRAM data controller circuit includes a combinational logic circuit.

4. The output control interface circuit according to claim 1, wherein the SRAM control detector circuit determines whether or not the control signal is stable by detecting whether or not an order of a first read operation comes after a write operation in the control signal.

5. The output control interface circuit according to claim 1, wherein the SRAM control detector circuit further receives a system reset signal and a first clock signal that is input to the SRAM, and the SRAM control detector circuit is configured to determine whether or not the system reset signal is stable before determining whether or not the control signal is stable,
    wherein, in response to determining that the system reset signal is not stable, the SRAM control detector circuit outputs the indication signal to indicate that the system reset signal is not stable, and the SRAM data controller circuit correspondingly outputs the output signal with the preset value,
    wherein, in response to determining that the system reset signal is stable, the SRAM control detector circuit further determines whether or not the control signal is stable, and outputs the indication signal correspondingly.

6. The output control interface circuit according to claim 5, wherein, after determining that the system reset signal is stable and before determining whether or not the control signal is stable, the SRAM control detector circuit outputs the indication signal to instruct the SRAM data controller circuit to output the output data signal with the preset value.

7. The output control interface circuit according to claim 5, wherein the SRAM control detector circuit further receives a second clock signal and is configured to detect whether or not the system reset signal is stable according to the second clock signal.

8. The output control interface circuit according to claim 7, wherein a frequency of the second clock signal is higher than a frequency of the first clock signal.

9. The output control interface circuit according to claim 7, wherein the SRAM control detector circuit is configured to further determine whether or not the system reset signal is stable after a system state transitions to a power-on state and a predetermined period of time elapses.

10. The output control interface circuit according to claim 9, wherein the SRAM control detector circuit further receives a power reset signal, and is configured to determine whether or not the system state transitions to the power-on state according to the power reset signal, and to determine whether or not the predetermined period of time has elapsed according to the second clock signal.

11. An output control method for a static random access memory (SRAM), the output control method comprising:
    configuring an SRAM data controller circuit to receive an indication signal and an SRAM output data signal output by the SRAM;
    configuring an SRAM control detector circuit to receive a control signal input to the SRAM, and determine whether or not the control signal is stable;
    in response to determining that the control signal is not stable, configuring the SRAM control detector circuit to output the indication signal to indicate that the control signal is not stable, and configuring the SRAM data controller circuit to correspondingly output the output data signal having a preset value according to the indication signal; and
    in response to determining that the control signal is stable, configuring the SRAM control detector circuit to output the indication signal to indicate that the control signal is stable, and configuring the SRAM data controller circuit to correspondingly output the SRAM output data signal as the output data according to the indication signal.

12. The output control method according to claim 11, wherein the SRAM control detector circuit includes a finite-state machine (FSM) circuit.

13. The output control method according to claim 11, wherein the SRAM data controller circuit includes a combinational logic circuit.

14. The output control method according to claim 11, further comprising configuring the SRAM control detector circuit to detect whether or not an order of a first read operation comes after a write operation in the control signal, so as to determine whether or not the control signal is stable.

15. The output control method according to claim 11, further comprising:
    configuring the SRAM control detector circuit to receive a system reset signal and a first clock signal that is input to the SRAM, and to determine whether or not the system reset signal is stable before determining whether or not the control signal is stable;

in response to determining that the system reset signal is not stable, configuring the SRAM control detector circuit to output the indication signal to indicate that the system reset signal is not stable, and configuring the SRAM data controller circuit to correspondingly output the output signal with the preset value; and, in response to determining that the system reset signal is stable, configuring the SRAM control detector circuit to further determine whether or not the control signal is stable, and to output the indication signal correspondingly.

16. The output control method according to claim 15, further comprising:

in response to determining that the system reset signal is stable, and before determining whether or not the control signal is stable, configuring the SRAM control detector circuit to output the indication signal to instruct the SRAM data controller circuit to output the output data signal with the preset value.

17. The output control method according to claim 15, further comprising:

configuring the SRAM control detector circuit to receive a second clock signal and detect whether or not the system reset signal is stable according to the second clock signal.

18. The output control method according to claim 17, wherein a frequency of the second clock signal is higher than a frequency of the first clock signal.

19. The output control method according to claim 17, further comprising:

configuring the SRAM control detector circuit to determine whether or not the system reset signal is stable after a system state transitions to a power-on state and a predetermined period of time elapses.

20. The output control method according to claim 19, further comprising:

configuring the SRAM control detector circuit to receive a power reset signal, and determine whether or not the system state transitions to the power-on state according to the power reset signal, and to determine whether or not the predetermined period of time has elapsed according to the second clock signal.

\* \* \* \* \*